United States Patent
Leon et al.

(10) Patent No.: US 7,205,624 B2
(45) Date of Patent: *Apr. 17, 2007

(54) SELF-ALIGNED IMPLANTED WAVEGUIDE DETECTOR

(75) Inventors: Francisco A. Leon, Palo Alto, CA (US); Lawrence C. West, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/959,897

(22) Filed: Oct. 6, 2004

(65) Prior Publication Data

US 2005/0212068 A1 Sep. 29, 2005

Related U.S. Application Data

(60) Provisional application No. 60/509,202, filed on Oct. 7, 2003.

(51) Int. Cl.
 *H01L 31/00* (2006.01)
(52) U.S. Cl. ...................... 257/458; 257/184
(58) Field of Classification Search ................ 257/458, 257/184, 21
 See application file for complete search history.

(56) References Cited

U.S. PATENT DOCUMENTS

| | | | |
|---|---|---|---|
| 4,486,765 A * | 12/1984 | Capasso ...................... 257/184 |
| 4,835,575 A | 5/1989 | Plihal | |
| 5,122,852 A | 6/1992 | Chan et al. | |
| 5,481,515 A | 1/1996 | Kando et al. | |
| 5,793,913 A | 8/1998 | Kovacic | |
| 5,818,096 A | 10/1998 | Ishibashi et al. | |
| 5,942,789 A | 8/1999 | Morikawa et al. | |
| 6,075,253 A | 6/2000 | Sugiyama et al. | |
| 6,426,522 B1 | 7/2002 | Kean et al. | |
| 6,690,078 B1 * | 2/2004 | Irissou et al. ................ 257/458 |
| 6,753,214 B1 | 6/2004 | Brinkmann et al. | |
| 6,770,134 B2 | 8/2004 | Maydan et al. | |
| 6,972,469 B2 * | 12/2005 | Peichl et al. ................ 257/458 |
| 2002/0174827 A1 | 11/2002 | Samoilov et al. | |
| 2004/0012037 A1 | 1/2004 | Venkatesan et al. | |

(Continued)

OTHER PUBLICATIONS

Pearsall et al., "Spectroscopy of Band-to-Band Optical Transitions in Si-Ge Alloys and Superlattices," Physical Review B, vol. 57, No. 15, 1998, pp. 9218-9140, Apr. 1998.

(Continued)

*Primary Examiner*—Mark V. Prenty
(74) *Attorney, Agent, or Firm*—WilmerHale

(57) ABSTRACT

A method of fabricating a detector, the method including forming an island of detector core material on a substrate, the island having a horizontally oriented top end, a vertically oriented first sidewall, and a vertically oriented second sidewall that is opposite said first sidewall; implanting a first dopant into the first sidewall to form a first conductive region that has a top end that is part of the top end of the island; implanting a second dopant into the second sidewall to form a second conductive region that has a top end that is part of the top end of the island; fabricating a first electrical connection to the top end of the first conductive region; and fabricating a second electrical connection to the top end of the second conductive region.

7 Claims, 3 Drawing Sheets

U.S. PATENT DOCUMENTS

| | | |
|---|---|---|
| 2004/0012041 A1 | 1/2004 | West et al. |
| 2004/0013338 A1 | 1/2004 | Bjorkman et al. |
| 2004/0037512 A1 | 2/2004 | Cho et al. |
| 2004/0155751 A1 | 8/2004 | Benzel et al. |
| 2005/0053347 A1 | 3/2005 | West et al. |
| 2005/0214964 A1* | 9/2005 | West et al. .................. 438/31 |
| 2006/0039666 A1 | 2/2006 | Knights et al. |

OTHER PUBLICATIONS

Tashiro et al., "A Selective Epitaxial SiGe/SI Planar Photodetector for Si-Based OEIC's," IEEE Transactions, vol. 44, No. 4, 1997, pp. 545-550, Apr. 1997.

Temkin et al., "Gex SI1-x Strained-Layer Superlattice Waveguide Photodetectors Operating Near 1.3um," Appl. Phys. Lett. vol. 48, No. 15, 1986, pp. 963-965, Apr. 1986.

Temkin et al., "Geo.6 SiO.4 Rib Waveguide Avalanche Photodetectors for 1.3 um Operation," Appl. Phys. Lett. 49, pp. 809-811, Sep. 1986.

Tashiro, A selective epitaxial SiGe/Si planar photodetector for Si-based OEIC's, IEEE Transactions on Electron Devices, 1997, pp. 545-550, 44(4), Apr. 1997.

Yang et al., A high spee, high sensitivity silicon lateral trench photodetector, IEEE Electron Device Letters vol. 23 No. 7, pp. 395-397, Jul. 2002.

* cited by examiner

SELF-ALIGNED IMPLANTED WAVEGUIDE DETECTOR

This application claims the benefit of U.S. Provisional Application No. 60/509,202, filed Oct. 7, 2003.

TECHNICAL FIELD

The invention generally relates to optical detectors and methods of fabricating such detectors.

BACKGROUND OF THE INVENTION

To build an optical signal distribution network within a semiconductor substrate, one needs to be able to make good optical waveguides to distribute the optical signals and one needs to be able to fabricate elements that get the optical signals into and out of the waveguides to interface with other circuitry. Extracting the optical signals can be accomplished in at least two ways. Either the optical signal itself is extracted out of the waveguide and delivered to other circuitry that can convert it to the required form. Or the optical can be converted into electrical form in the waveguide and the electrical signal delivered to other the circuitry. Extracting the optical signal as an optical signal involves the use of mirrors within the waveguides or elements that function like mirrors. The scientific literature has an increasing number of examples of technologies that can be used to construct such mirrors. Extracting the optical signal as an electrical signal involves the use of detector within the waveguide, i.e., circuit elements that convert the optical signal to an electrical form. The scientific literature also has an increasing number of examples of detector designs that can be used to accomplish this.

The challenge in finding the combination of elements that produces an acceptable optical distribution network becomes greater, however, when one limits the frame of reference to particular optical signal distribution network designs and to the financial reality that any such designs should be easy to fabricate and financially economical.

The combination of silicon and SiGe has attracted attention as useful combination of materials from which one might be able to easily and economically fabricate optical signal distribution networks. With SiGe it is possible to fabricate waveguides in the silicon substrates. The index of refraction of SiGe is slightly higher than that of silicon. For example, SiGe with 5% Ge has a index of refraction of about 3.52 at an optical wavelength of about 1300 nm while crystalline silicon has an index of refraction that is less than that, e.g. about 3.50. So, if a SiGe core is formed in a silicon substrate, the difference in the indices of refraction is sufficient to enable the SiGe core to contain an optical signal through internal reflections. Moreover, this particular combination of materials lends itself to the use of conventional semiconductor fabrication technologies to fabricate the optical circuitry.

Of course, for such a system to work as an optical signal distribution network, the optical signal must be at a wavelength at which the Si and SiGe are transparent. Since the bandgap of these materials is about 1.12 eV, they appear transparent to the commonly used optical wavelengths of greater than about 1100 nm. But, the transparency of these materials to optical signals having those wavelengths brings with it another problem. These materials are generally not suitable for building detectors that can convert the optical signals to electrical form. To be a good detector, the materials must be able to absorb the light. That is, the optical signal must be capable of generating electron transitions from the valence band to the conduction band within the detector to produce an electrical output signal. But the wavelengths of greater than about 1100 nm are too long to produce electron transitions in silicon. For example, at a wavelength of 1300 nm, the corresponding photon energy is about 0.95 eV, which is well below the bandgap of silicon or SiGe and consequently well below the amount necessary to cause transitions from the valence band into the conductor band.

One class of detectors that has attracted some interest is the class of SiGe super lattice detectors. These detectors are made up of alternating thin layers of Si and SiGe. Because the lattice constant of these materials is not the same, when the two layers are grown on top of each other the lattice mismatch causes a strain in the SiGe layer. If the Si and SiGe layers are sufficiently thin (e.g. on the order of about 6 nm), and if the process temperatures to which the structure is exposed are sufficiently low (e.g. below about 800° C.), then the induced strain will be permanent. The induced strain reduces the bandgap of the SiGe material. As the percentage of Ge in the SiGe increases, the mismatch becomes greater, the induced strain increases and the bandgap decreases further.

FIG. 1 illustrates how the percentage of Ge impacts the bandgap in the super lattice structures. If the induced strain is maintained in the SiGe, as the percentage of Ge increases, the bandgap decreases along the lower curve. At some point the percentage of Ge will be enough to reduce the bandgap sufficiently so that it can serve as a detector for light having wavelengths of about 1200 nm (about 0.9 eV). However, if the lattice is allowed to relax thereby relieving the strain, the affect of increasing amounts of Ge on the bandgap will be less dramatic as indicated by the upper curve and it will not be possible fabricate an effective detector for that wavelength.

SUMMARY OF THE INVENTION

In general, in one aspect, the invention features a method of fabricating a detector. The method involves forming an island of detector core material on a substrate, the island having a horizontally oriented top end, a vertically oriented first sidewall, and a vertically oriented second sidewall that is opposite said first sidewall; implanting a first dopant into the first sidewall to form a first conductive region that has a top end that is part of the top end of the island; implanting a second dopant into the second sidewall to form a second conductive region that has a top end that is part of the top end of the island; fabricating a first electrical connection to the top end of the first conductive region; and fabricating a second electrical connection to the top end of the second conductive region.

Embodiments have one or more of the following additional features. The process of forming of the island involves forming a layer of the detector core material on the substrate; and etching away selective portions of the detector core material layer to form the island of detector core material. The process of forming of the island also involves, after forming the layer of the detector core material on the substrate, forming a hard mask layer over the top end of the detector core material layer, and the etching away involves etching away selective portions of the hard mask layer and the detector core material layer to form the island of detector core material. The method further involves, after implanting the first and second dopants, removing the hard mask layer from the top end of the island; depositing an isolation material onto the substrate and covering the island; and planarizing the deposited isolation material so that the top ends of the first and second conductive regions are exposed. The method also involves depositing an insulator onto the planarized material; forming a first opening in the insulator above and extending down to the first conductive regions and a second opening in the insulator above and extending down to the second conductive regions; and depositing a metal in the first and second openings to make electrical contact to the first conductive regions. The process of implanting the first dopant involves implanting a p-type dopant and the process of implanting the second dopant involves implanting an n-type dopant. Alternatively, the first and second dopants are the same materials.

In general, in another aspect, the invention features an optical detector including a substrate; and an island of detector material formed on the substrate, wherein the island has (1) a horizontally oriented top end, a vertically oriented first sidewall, and vertically oriented second sidewall that is opposite said first sidewall, (2) a first doped region extending into the island through first sidewall and forming a first conductive region that extends down into the island of detector material, and (3) a second doped region extending into the island through the second sidewall and forming a second conductive region that extends down into island of the detector material, the first and second conductive regions each having a top end that is part of the top end of the island. The optical detector also includes a first electrical connection to the top end of the first conductive region; and a second electrical connection to the top end of the second conductive region.

Embodiments include one or more of the following additional features. The optical detector also includes an isolation material covering the first sidewall and the second sidewall of the island and forming a upper surface that is level with the top end of the island; an insulating layer over the isolation material and the island, the insulating layer including a first hole down to the first conductive region and a second hole down to the second conductive region; a first conductor filing the first hole and electrically connecting to the first conductive region; and a second conductor filing the second hole and electrically connecting to the second conductive region. The first conductive region is doped with a p-type dopant and the second conductive region is doped with an n-type dopant. Alternatively, the first and second conductive regions are doped with the same dopant.

One advantage of some embodiments of the invention is that one can avoid having to use separate masks for the $N^+$ and $P^+$ implants in the $N^+$—I—$N^+$ and $P^+$—I—$N^+$ structures.

Another advantage is that it provides a way of fabricating horizontally oriented detectors on a semiconductor substrate.

Other features and advantages of the invention will be apparent from the following detailed and from the claims.

DETAILED DESCRIPTION

Figure 2A:
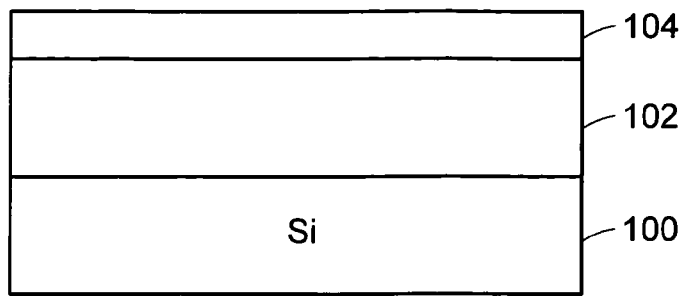
FIGS. 2A–G illustrate the process for fabricating a SiGe super lattice detector.

Referring to FIG. 2A, starting with a substrate 100, e.g. a silicon substrate, a SiGe super lattice structure 102 is deposited onto the upper surface of substrate 100. Procedures for fabricating such a structure are generally known in the art and thus will not be described in detail here. In the described embodiment, the basic building block of the super lattice is a SiGe layer grown on top of a Si layer. The SiGe layer is thin enough to sustain the induced strain without relaxing (e.g. about 6 nm) with the percentage of Ge being about 60%. The Si layer is about 29 nm think. This basic two-layer building block is repeated about 29 times to fabricate a stack that is about 1 micron high. In the described embodiment, an epitaxial process is used to grow these layers with the composition of the feed gas varied throughout the process to deposit the individual layers.

Figure 2B:
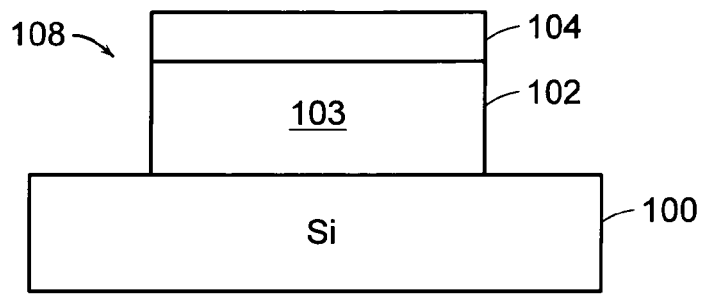

After the super lattice is deposited, a hard mask protective layer 104 is formed over the entire surface of the super lattice structure. The purpose of hard mask is to protect the upper surface of the Si/SiGe super lattice structure from being doped during subsequent implantations that are use to form vertically oriented electrodes on either side of the structure. The hard mask can be, for example, $SiO_2$ which can be formed in one of a number of different ways including oxidizing the surface or epitaxially growing an oxide layer on the surface. Using standard photolithographic techniques, hard mask layer 104 is patterned to define islands 108 of material that are located where the detectors are required. Material outside of the islands defined by the patterned hard mask layer is removed by etching it away (see FIG. 2B).

Each island 108 defines the core 103 of the to-be-formed detector, which in this embodiment is a Si/SiGe super lattice detector.

Figure 2C:
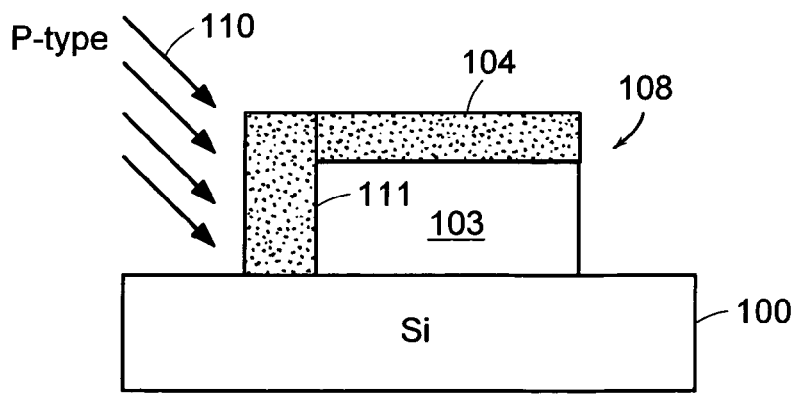

With the islands now formed at appropriate predefined locations on the surface of the substrate, the substrate is exposed to two separate ion implantation processes. In the first ion implantation process, the substrate is oriented within the ion implantation chamber so one side of the island is exposed to the beam and oriented about at about 45° relative to the ion beam while the other side of the island is protected from the ion beam by being within the shadow of the island, as illustrated in FIG. 2C. In this orientation, a p-type dopant (e.g. boron) 110 is implanted into one side of the island to form a vertically oriented p-type electrode 111. In the described embodiment, the ion beam energy is about 100–200 kV and the dopant (e.g. boron or phosphorous) is implanted to a depth of about 200 nm. and with a sufficient dose so the resulting doping levels will be above about $10^{18}$ $cm^{-3}$.

Figure 2D:
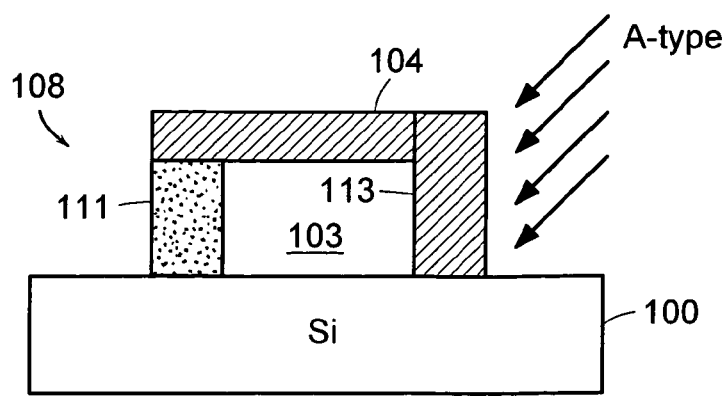

After the $P^+$ side is implanted, the same procedure is used to implant an n-type dopant (e.g. phosphorus) on the other side of island 108 (see FIG. 2D) to form a vertically oriented n-type electrode 113. This time the substrate is oriented within the corresponding ion implantation chamber so the other non-implanted side of the island is exposed to the beam and oriented about at about 45° relative to the ion beam while the previously implanted side is protected from the ion beam by being within the shadow of the island, as illustrated in FIG. 2D.

During these two implantation processes, the portion of hard mask layer 104 that remains on top of island 108 protects the top of island 108 from being implanted with dopants.

After the implantation of the dopants for the electrodes, an optional low temperature anneal can be used to diffuse the dopants into the structure to a deeper level, e.g. 300 nm. Of course, the temperature used for the anneal must be low enough so that the induced strain in the Si/SiGe super lattice structure does not relax during the anneal process.

Figure 2E:
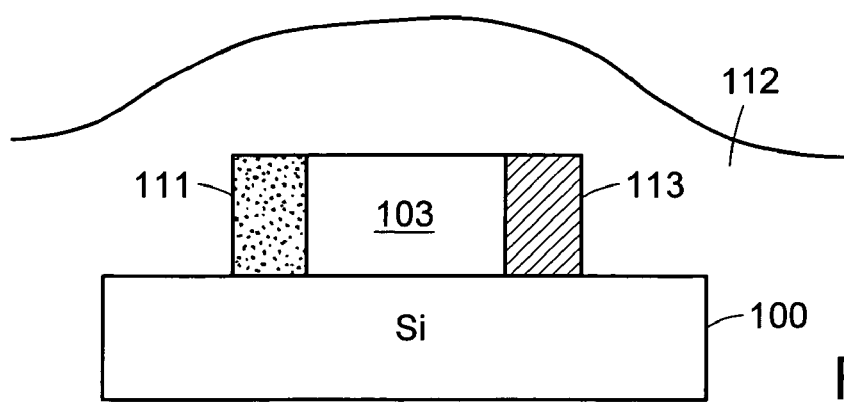
Figure 2F:
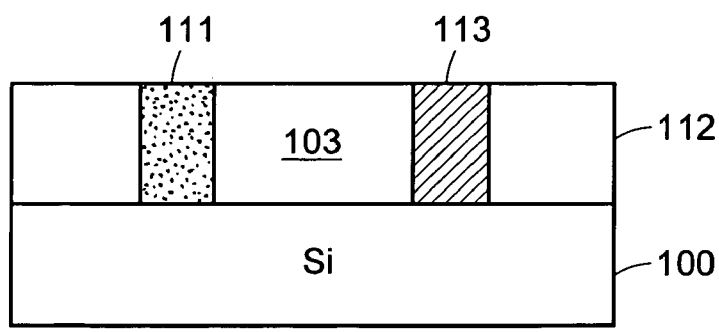

After both sides of the island are implanted, hard mask 104 is stripped off (see FIG. 2E) exposing the top portions of the two implanted regions. Then, an isolation material 112 (e.g. epitaxial silicon or $SiO_2$) is formed over the surface of the substrate and having a thickness that is at least as great as the height of the islands. One purpose of this material is to fill in the regions between the regions between the detector structures and other devices.

After the isolation material has been formed over the substrate, the substrate is then planarized using, for example, chemical mechanical polishing (CMP) to remove isolating material 112 down to the top surface of the island, exposing the top portions to the two vertically oriented electrodes 111 and 113.

At some point during subsequent fabrication, electrical connection will be made to the top portions of the two vertically oriented electrodes 111 and 113. When this happens depends on what other circuitry is to be fabricated on the substrate. In essence, the subsequent steps will involve (referring to FIG. 2G) forming an insulating layer 120 (e.g. $SiO_2$) over the detector, patterning openings 122 through that insulating layer and extending down to the electrodes, and then depositing a metal 124 within the openings to make electrical contact to the two electrodes. Using a silicide process to improve the ohmic character of the electrical contacts at the top of the electrodes is also an option.

For an optical mode to sit comfortably within the detector region, that region needs to be tall (M) and narrow (L). Also, the width L of the detector region impacts the speed of the device. That is, a narrower detector region yields a quicker transit time for the electrons. So to produce faster detectors L must be kept sufficiently small. In the described embodiment, L≈0.5μ and M≈1–2μ.

Figure 1:
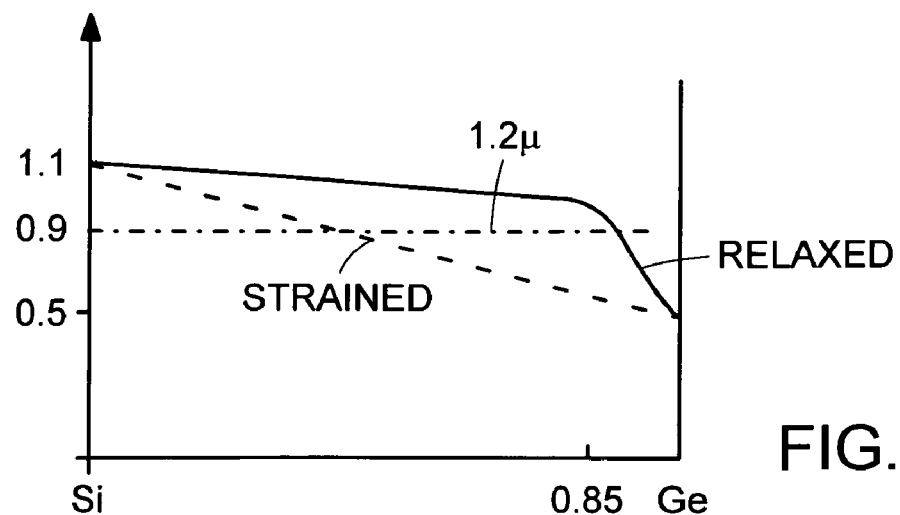
FIG. 1 shows the affect on bandgap of the percentage of Ge in a SiGe super lattice structure.
Figure 3:
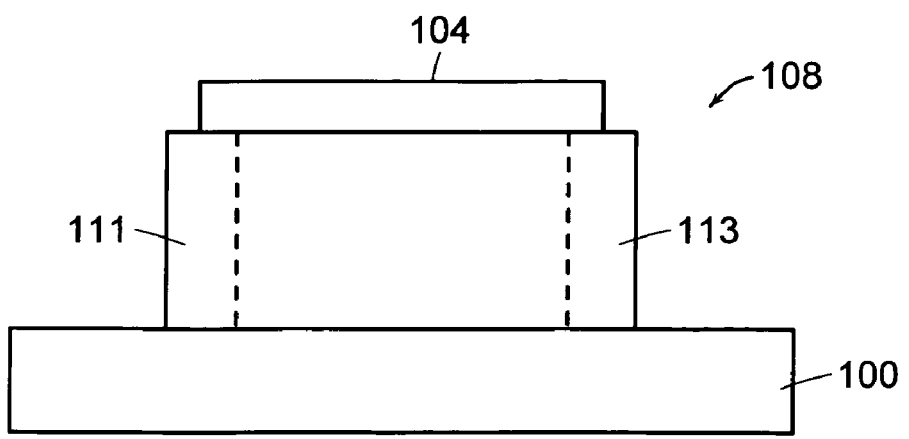
FIG. 3 illustrates use of a narrower hard mask so as to allow implantation of electrode dopants over more of the top of the structure.

In the embodiments shown in FIGS. 2A–G, hard mask 104 shadows the upper portions of islands 108 just under mask 104. To increase the coverage of the implanted dopants at the top of the electrodes, one can etch back the hard mask as shown in FIG. 3. This would allow the side implants to more effectively reach the topmost portions of the electrodes.

The detectors described above are considered to particularly useful in fabrication of the optical ready substrates such as are described in detail in U.S. patent application Ser. No. 10/280,505, filed Oct. 25, 2002, entitled "Optical Ready Substrates," and U.S. patent application Ser. No. 10/280,492, filed Oct. 25, 2002, entitled "Optical Ready Wafers," both of which are incorporated herein by reference. Some of the waveguides that are mentioned in connection with the optical ready substrates are SiGe waveguides. Methods of making such waveguides are described in publicly available scientific literature including, for example, U.S. patent application Ser. No. 09/866,172, filed May 24, 2001, entitled "Method for Fabricating Waveguides," and to U.S. patent application Ser. No. 10/014,466, filed Dec. 11, 2001, entitled "Waveguides Such As SiGeC Waveguides and Method of Fabricating Same," both of which are incorporated herein by reference.

Figure 2G:
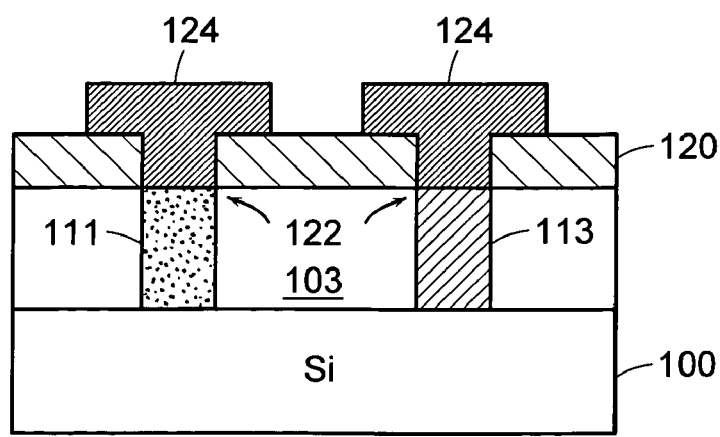

If used in connection with waveguides such as are described above, one option is to first fabricate the detectors on the substrate and then fabricate the waveguides to which the detectors are coupled. The detector is aligned with the waveguide so that an electrode is positioned on either side of the waveguide. In FIG. 2G that would mean that the axis of the waveguide is normal to the plane of the figure and aligned with the detector core (i.e., SiGe super lattice 102). The detector is made sufficiently long along the axis of the waveguide to yield the desired absorption/sensitivity.

The specifics of the implantation process described above are meant to merely be illustrative. As is known to persons skilled in the art, a wide range of alternative process conditions can be used to accomplish the implantation of the dopants in the vertical regions that will constitute the electrodes. In general during the implantation phase of the fabrication process, the goal is to choose the ion implanting energies, the doses, the times and the temperatures so as to produce heavily doped, low resistivity regions which will function as electrodes. A typical energy for implanting the dopants is between 100 kV and 200 kV, which is the range of energies in which of many commercially available implantation systems operate. In general, the ion energy needs to be sufficient to get adequate projected range into the host SiGe (e.g. at least about 0.1μ) so the dopant remains in the host material during subsequent processing.

In reality, the implant energies can be as low as a few hundred eV or as high as a few MeV. If low implant energies are used, then other known techniques will likely have to be employed to prevent that shallow implanted material from evaporating during subsequent processing before it is able to diffuse into the host material. A commonly used well-known technique to address this problem is to use a capping layer (e.g. $SiO_2$ or $Si_3N_4$) to hold the implant in place until the diffusion into the host material has taken place.

The hard mask is used to protect against forming an electrical short across the top of the island between the two conductive regions on opposite sides of the island. In the case of a $P^+$—I—$N^+$ structure, however, the hard mask may be omitted since there would be less risk of producing an electrical short between the two conductive regions of opposite conductivity types.

The structure described herein and the method of fabricating it can be used for a wide variety of optical detectors other than optical detectors that employ Si/SiGe super lattice cores 103. For example, it can also be used for $N^+$—I—$N^+$ and $P^+$—I—$N^+$ structures, where the I-region is made of any suitable material that is appropriate for performing the optical detection function of the device.

Other embodiments are within the following claims.

What is claimed is:

1. An optical detector comprising:
   a substrate;
   an island of detector material formed on and occupying only a portion of a surface of the substrate, said island having a horizontally oriented top end, a vertically oriented first sidewall, and vertically oriented second sidewall that is opposite said first sidewall, said island having a first doped region extending into the island through first sidewall and forming a first conductive region that extends down into the island of detector material, said island also having a second doped region extending into the island through the second sidewall and forming a second conductive region that extends down into island of the detector material, the first and second conductive regions each having a top end that is part of the top end of the island and together in combination with the intervening detector material defining a horizontally-oriented device structure on the substrate;

an isolation material formed on the surface of the substrate and covering the doped regions of the first and second sidewalls of the island at least up to the top of the island;

a first electrical connection to the top end of the first conductive region; and a second electrical connection to the top end of the second conductive region.

2. The optical detector of claim 1 further comprising:

an insulating layer over the isolation material and the island, said insulating layer including a first hole down to the first conductive region and a second hole down to the second conductive region;

a first conductor filling the first hole and electrically connecting to the first conductive region; and a second conductor filling the second hole and electrically connecting to the second conductive region.

3. The optical detector of claim 1 wherein the first conductive region is doped with a p-type dopant.

4. The optical detector of claim 3 wherein the second conductive region is doped with an n-type dopant.

5. The optical detector of claim 1 wherein the first and second conductive regions are doped with the same dopant.

6. The optical detector of claim 1 wherein the first and second conductive regions are doped with different dopants.

7. The optical detector of claim 1 wherein the first and second sidewalls are substantially perpendicular to the surface of the substrate.

* * * * *